United States Patent
Baum et al.

(10) Patent No.: US 8,792,281 B2
(45) Date of Patent: *Jul. 29, 2014

(54) READ THRESHOLD ESTIMATION IN ANALOG MEMORY CELLS USING SIMULTANEOUS MULTI-VOLTAGE SENSE

(75) Inventors: Barak Baum, Givatayim (IL); Eyal Gurgi, Petah-Tikva (IL)

(73) Assignee: Apple Inc., Cupertino, CA (US)

( * ) Notice: Subject to any disclaimer, the term of this patent is extended or adjusted under 35 U.S.C. 154(b) by 43 days.

This patent is subject to a terminal disclaimer.

(21) Appl. No.: 13/590,816

(22) Filed: Aug. 21, 2012

(65) Prior Publication Data

US 2014/0056066 A1    Feb. 27, 2014

(51) Int. Cl.
*G11C 16/06* (2006.01)
*G11C 16/26* (2006.01)
*G11C 7/06* (2006.01)

(52) U.S. Cl.
CPC ............. *G11C 16/26* (2013.01); *G11C 7/065* (2013.01)
USPC ............. 365/185.21; 365/185.11; 365/185.25

(58) Field of Classification Search
CPC ................................ G11C 7/065; G11C 16/26
USPC ............................. 365/185.11, 185.21, 185.25
See application file for complete search history.

(56) References Cited

U.S. PATENT DOCUMENTS

| | | | |
|---|---|---|---|
| 5,657,332 A * | 8/1997 | Auclair et al. | 714/763 |
| 8,000,135 B1 * | 8/2011 | Perlmutter et al. | 365/185.03 |
| 8,156,398 B2 | 4/2012 | Sommer | |
| 8,174,905 B2 | 5/2012 | Shalvi et al. | |
| 8,482,978 B1 * | 7/2013 | Perlmutter et al. | 365/185.03 |
| 2004/0223371 A1 | 11/2004 | Roohparvar | |
| 2006/0126383 A1 | 6/2006 | Shappir et al. | |
| 2009/0323412 A1 | 12/2009 | Mokhlesi et al. | |
| 2010/0091535 A1 | 4/2010 | Sommer et al. | |
| 2010/0131827 A1 | 5/2010 | Sokolov et al. | |
| 2012/0063227 A1 | 3/2012 | Weingarten et al. | |
| 2012/0320672 A1 * | 12/2012 | Meir et al. | 365/185.03 |

OTHER PUBLICATIONS

Samsung Electronics, "A 3.3 1Gb Multi-Level NAND Flash Memory with Non-Uniform Threshold Voltage Distribution", Taehee Cho, et al., pp. 1-4, Feb. 5, 2013, Kyunggi, Korea.

International Search Report and Written Opinion from PCT/US2013/054386, mailed Nov. 7, 2013, Apple Inc., pp. 1-13.

* cited by examiner

*Primary Examiner* — Hoai V Ho
(74) *Attorney, Agent, or Firm* — Meyertons, Hood, Kivlin, Kowert & Goetzel, P.C.

(57) ABSTRACT

A method includes dividing a group of analog memory cells into multiple subsets. The memory cells in the group are sensed simultaneously by performing a single sense operation, while applying to the subsets of the memory cells respective different sets of read thresholds, so as to produce respective readout results. An optimal set of the read thresholds is estimated by processing the multiple readout results obtained from the respective subsets using the different sets of the read thresholds.

29 Claims, 4 Drawing Sheets

READ THRESHOLD ESTIMATION IN ANALOG MEMORY CELLS USING SIMULTANEOUS MULTI-VOLTAGE SENSE

FIELD OF THE INVENTION

The present invention relates generally to memory devices, and particularly to methods and systems for estimating thresholds for reading analog memory cells.

BACKGROUND OF THE INVENTION

Several types of memory devices, such as Flash memories, use arrays of analog memory cells for storing data. Each analog memory cell holds a certain level of a given physical quantity such as an electrical charge or voltage, which represents the data stored in the cell. The levels of this physical quantity are also referred to as analog storage values or analog values. In Flash memories, for example, each analog memory cell holds a certain amount of electrical charge. The range of possible analog values is typically divided into regions, each region corresponding to a programming state or programming level that represents one or more data bit values. Data is written to an analog memory cell by writing a nominal analog value that corresponds to the desired bit or bits.

Some memory devices, which are commonly referred to as Single-Level Cell (SLC) devices, store a single bit of information in each memory cell, i.e., each memory cell can be programmed to assume two possible memory states. Higher-density devices, often referred to as Multi-Level Cell (MLC) devices, store two or more bits per memory cell, i.e., can be programmed to assume more than two possible memory states.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate," Proceedings of the 2002 IEEE International Solid-State Circuits Conference (ISSCC 2002), San Francisco, Calif., Feb. 3-7, 2002, pages 100-101, which is incorporated herein by reference. Other exemplary types of analog memory cells are Floating Gate (FG) cells, Ferroelectric RAM (FRAM) cells, magnetic RAM (MRAM) cells, Charge Trap Flash (CTF) and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the 24$^{th}$ International Conference on Microelectronics (MIEL), Nis, Serbia and Montenegro, May 16-19, 2004, volume 1, pages 377-384, which is incorporated herein by reference.

Analog memory cells, such as Flash memory cells, are typically read by comparing the analog cell values to one or more read thresholds. Various techniques for setting and adjusting read thresholds are known in the art. For example, U.S. Pat. No. 5,657,332, whose disclosure is incorporated herein by reference, describes methods for recovering from hard errors in a solid-state memory system. A memory system includes an array of memory cells, each cell capable of having its threshold voltage programmed or erased to an intended level. An error checking scheme is provided for each of a plurality of groups of cells for identifying read errors therein. A read reference level is adjusted before each read operation on the individual group of cells containing read errors, each time the read reference level being displaced a predetermined step from a reference level for normal read, until the error checking means no longer indicates read errors. The drifted threshold voltage of each cell associated with a read error is re-written to its intended level.

U.S. Patent Application Publication 2007/0091677, whose disclosure is incorporated herein by reference, describes techniques for reading data from one or more Flash memory cells, and for recovering from read errors. In some embodiments, in the event of an error correction failure by an error detection and correction module, the Flash memory cells are re-read at least once using one or more modified reference voltages, until successful error correction may be carried out.

U.S. Pat. No. 6,963,505, whose disclosure is incorporated herein by reference, describes methods for determining a reference voltage. In some embodiments, a set of operating reference cells is established to be used in operating cells in a Non-Volatile Memory (NVM) block or array. At least a subset of cells of the NVM block or array may be read using each of two or more sets of test reference cells, where each set of test reference cells may generate or otherwise provide reference voltages at least slightly offset from each other set of test reference cells. For each set of test reference cells used to read at least a subset of the NVM block, a read error rate may be calculated or otherwise determined. A set of test reference cells associated with a relatively low read error rate may be selected as the set of operating reference cells to be used in operating other cells, outside the subset of cells, in the NVM block or array.

U.S. Patent Application Publication 2010/0091535, whose disclosure is incorporated herein by reference, describes various techniques for adjusting read thresholds of analog memory cells. In one of the disclosed techniques, data is encoded with an Error Correction Code (ECC) before it is stored in the memory cells. When retrieving data from the memory cells, the ECC is decoded in order to correct read errors. For a given read error that was corrected by the ECC, the direction of the error, i.e., the programming level with which the read storage value was erroneously associated before applying ECC correction, is determined. Information regarding directions of corrected errors is used for adjusting the read thresholds.

U.S. Patent Application Publication 2012/0063227, whose disclosure is incorporated herein by reference, describes a system and method for adjusting read threshold voltage values, for example, in a read circuit internal to a memory device. The quality of an associated read result may be estimated for each read threshold voltage value used to read memory cells. Only read results estimated to have sufficient quality may be allowed to pass to storage. The read threshold voltage value may be adjusted for subsequent read operations, for example, if the associated read result is estimated to have insufficient quality. The read threshold voltage value may be iteratively adjusted, for example, until a read result is estimated to have sufficient quality.

SUMMARY OF THE INVENTION

An embodiment of the present invention that is described herein provides a method including dividing a group of analog memory cells into multiple subsets. The memory cells in the group are sensed simultaneously by performing a single sense operation, while applying to the subsets of the memory cells respective different sets of read thresholds, so as to produce respective readout results. An optimal set of the read thresholds is estimated by processing the multiple readout results obtained from the respective subsets using the different sets of the read thresholds.

In some embodiments, the memory cells in the group are associated with a single word line. In an embodiment, estimating the optimal set of the read thresholds includes assessing respective quality levels of the different sets of the read thresholds based on the corresponding readout results, and deriving the optimal set of the read thresholds from the quality levels.

In a disclosed embodiment, the multiple subsets of the memory cells store respective separate Error Correction Code (ECC) code words, and assessing the quality levels includes assessing respective metrics relating to the respective ECC code words. In an example embodiment, the metrics include respective degrees of success in decoding the respective ECC code words.

In another embodiment, assessing the quality levels includes assessing respective statistical distributions of analog values of the memory cells relative to the read thresholds. In still another embodiment, deriving the optimal set of the read thresholds includes assessing the quality levels by combining the readout results, and processing the combined readout results to produce the optimal set.

In some embodiments, applying the different sets of the read thresholds includes charging bit lines in each subset of the memory cells to a different respective charge voltage. Additionally or alternatively, applying the different sets of the read thresholds may include applying a different respective gate voltage to the memory cells in each of the subsets. Further additionally or alternatively, applying the different sets of the read thresholds may include varying a voltage applied to the memory cells as a function of respective positions of the memory cells within the group. In yet another embodiment, applying the different sets of the read thresholds includes sensing bit lines in each subset of the memory cells after a different discharge time.

In another example embodiment, the memory cells are connected to respective bit lines and arranged along a word line, applying the different sets of the read thresholds includes applying multiple different read voltages to the word line during a single cycle of charging the bit lines, and sensing the memory cells includes sensing each subset of the memory cells using one or more of the read voltages corresponding to the subset.

In some embodiments, the method further includes reading the memory cells in the group using the optimal set of the read thresholds. In an embodiment, estimating the optimal set of the read thresholds includes selecting one of the different sets of the read thresholds to serve as the optimal set. In an alternative embodiment, the optimal set of the read thresholds differs from any of the different sets of the read thresholds.

In an embodiment the method includes, during the single sense operation, sensing the memory cells in at least one of the subsets at an additional sense time so as to produce additional readout results that correspond to an additional set of the read thresholds, and estimating the optimal set includes processing the multiple readout results and the additional readout results.

There is additionally provided, in accordance with an embodiment of the present invention, apparatus including a memory and storage circuitry. The memory includes a plurality of analog memory cells. The storage circuitry is configured to divide a group of the memory cells into multiple subsets, to sense the memory cells in the group simultaneously by performing a single sense operation, while applying to the subsets of the memory cells respective different sets of read thresholds, so as to produce respective readout results, and to estimate an optimal set of the read thresholds by processing the multiple readout results obtained from the respective subsets using the different sets of the read thresholds.

There is also provided, in accordance with an embodiment of the present invention, apparatus including an interface and storage circuitry. The interface is configured to communicate with a memory that includes a plurality of analog memory cells. The storage circuitry is configured to divide a group of the memory cells into multiple subsets, to sense the memory cells in the group simultaneously by performing a single sense operation, while applying to the subsets of the memory cells respective different sets of read thresholds, so as to produce respective readout results, and to estimate an optimal set of the read thresholds by processing the multiple readout results obtained from the respective subsets using the different sets of the read thresholds.

The present invention will be more fully understood from the following detailed description of the embodiments thereof, taken together with the drawings in which:

DETAILED DESCRIPTION OF EMBODIMENTS

Overview

Embodiments of the present invention that are described herein provide improved methods and systems for computing read thresholds for reading analog memory cells. In some embodiments, a memory system comprises a plurality of analog memory cells and associated storage circuitry. The storage circuitry, e.g., a memory controller and/or internal circuitry coupled to the memory cells, reads a group of analog memory cells simultaneously in a single sense operation, while applying different candidate sets of read thresholds to respective different subsets of the memory cells in the group.

In an example embodiment, the group of memory cells comprises the memory cells along a given word line of a Flash memory. The memory cells along the word line are divided into two or more subsets, and the storage circuitry executes a single sense operation that applies a different set of candidate read thresholds to each subset.

An optimal set of read thresholds is then estimated based on the multiple resulting readout results obtained using the different sets of candidate thresholds. The optimal set may comprise one of the candidate sets, or a different set that is computed based on the candidate sets. The optimal set of read thresholds may be used for reading the same group of memory cells or a different group, such as another word line in the same memory block.

The storage circuitry may use various techniques for sensing different subsets of memory cells simultaneously using different candidate sets of read thresholds. For example, the storage circuitry may charge the bit lines of the memory cells in each subset to a different voltage, or apply a different gate voltage to the memory cells in each subset.

In some embodiments, the storage circuitry assesses a respective quality level for each candidate set of read thresholds based on the readout results of that set, and derives the optimal set of read thresholds from the quality levels of the various candidate sets. In an example embodiment, each subset of memory cells may hold a separate Error Correction Code (ECC) code word, and the storage circuitry may assess the level of success in decoding each ECC code word. The quality levels may comprise various metrics related to the ECC, not necessarily proportional to the degree of decoding success. One example of such a metric is the number of satisfied parity check equations.

Since the disclosed techniques evaluate multiple candidate sets of read threshold simultaneously, they are able to estimate the optimal set of read thresholds with small latency and modest computational complexity. In some embodiments, the threshold evaluation process can be further accelerated by sensing one or more of the subsets at different sense times, thus effectively evaluating multiple sets of read thresholds on the same subset of memory cells in the same sense operation.

System Description

Figure 1:
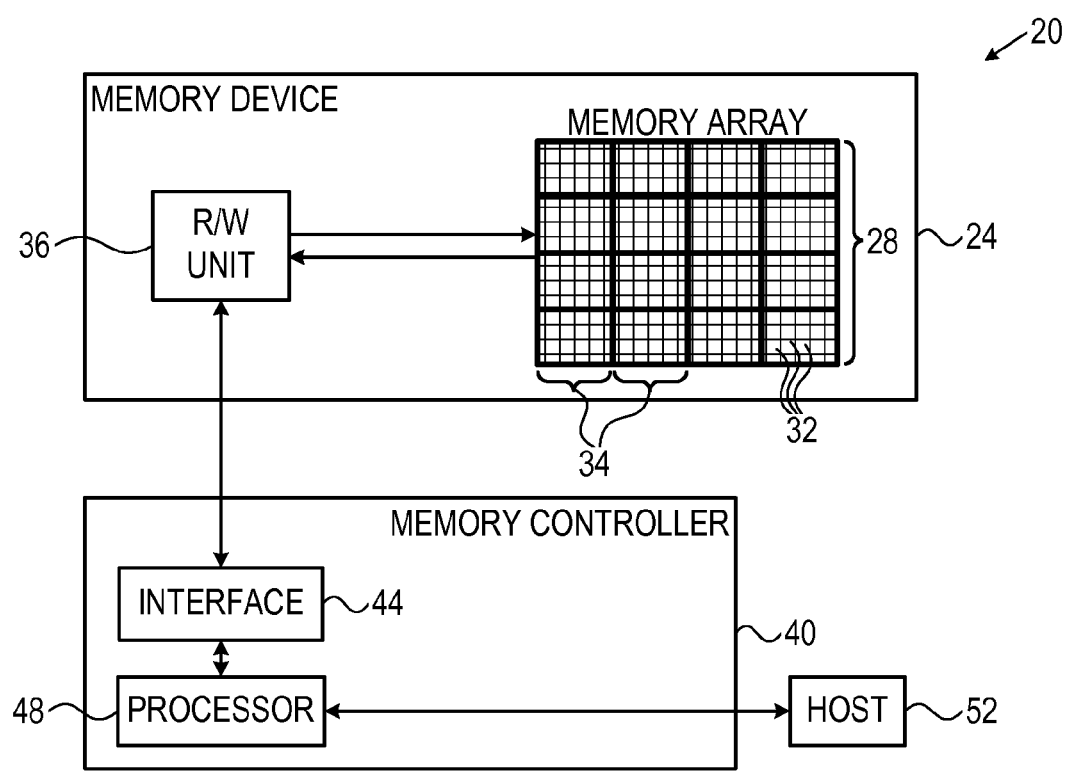
FIG. 1 is a block diagram that schematically illustrates a memory system, in accordance with an embodiment of the present invention.

FIG. 1 is a block diagram that schematically illustrates a memory system 20, in accordance with an embodiment of the present invention. System 20 can be used in various host systems and devices, such as in computing devices, cellular phones or other communication terminals, removable memory modules (sometimes referred to as "USB Flash Drives"), Solid State Disks (SSD), digital cameras, music and other media players and/or any other system or device in which data is stored and retrieved.

System 20 comprises a memory device 24, which stores data in a memory cell array 28. The memory array comprises multiple memory blocks 34. Each memory block 34 comprises multiple analog memory cells 32. In the context of the present patent application and in the claims, the term "analog memory cell" is used to describe any memory cell that holds a continuous, analog value of a physical parameter, such as an electrical voltage or charge. Array 28 may comprise analog memory cells of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM) and/or Dynamic RAM (DRAM) cells. Although the embodiments described herein refer mainly to two-dimensional (2D) cell connectivity schemes, the disclosed techniques are applicable to three-dimensional (3D) connectivity schemes, as well.

The charge levels stored in the cells and/or the analog voltages or currents written into and read out of the cells are referred to herein collectively as analog values, analog storage values or storage values. The storage values may comprise, for example, threshold voltages or any other suitable kind of storage values. System 20 stores data in the analog memory cells by programming the cells to assume respective programming states, which are also referred to as programming levels. The programming states are selected from a finite set of possible states, and each programming state corresponds to a certain nominal storage value. For example, a 3 bit/cell MLC can be programmed to assume one of eight possible programming states by writing one of eight possible nominal storage values into the cell.

Memory device 24 comprises a reading/writing (R/W) unit 36, which converts data for storage in the memory device to analog storage values and writes them into memory cells 32. In alternative embodiments, the R/W unit does not perform the conversion, but is provided with voltage samples, i.e., with the storage values for storage in the cells. When reading data out of array 28, R/W unit 36 converts the storage values of memory cells 32 into digital samples having a resolution of one or more bits. Data is typically written to and read from the memory cells in groups that are referred to as pages. In some embodiments, the R/W unit can erase a group of cells 32 by applying one or more negative erasure pulses to the cells. Erasure is typically performed in entire memory blocks.

The storage and retrieval of data in and out of memory device 24 is performed by a memory controller 40. The memory controller comprises an interface 44 for communicating with memory device 24, and a processor 48 that carries out the various memory management functions. Memory controller 40 communicates with a host 52, for accepting data for storage in the memory device and for outputting data retrieved from the memory device. Memory controller 40, and in particular processor 48, may be implemented in hardware. Alternatively, the memory controller may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

Although the example of FIG. 1 shows a single memory device 24, system 20 may comprise multiple memory devices that are controlled by memory controller 40. In the exemplary system configuration shown in FIG. 1, memory device 24 and memory controller 40 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 40 can be implemented in software and carried out by a processor or other element of the host system. In some embodiments, host 44 and memory controller 40 may be fabricated on the same die, or on separate dies in the same device package.

In some embodiments, memory controller 40 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In an example configuration of array 28, memory cells 32 are arranged in multiple rows and columns, and each memory cell comprises a floating-gate transistor. The gates of the transistors in each row are connected by word lines, and the sources of the transistors in each column are connected by bit lines. The memory array is typically divided into multiple pages, i.e., groups of memory cells that are programmed and read simultaneously. Pages are sometimes sub-divided into sectors. In some embodiments, each page comprises an entire row of the array. In alternative embodiments, each row (word line) can be divided into two or more pages. For example, in some devices each row is divided into two pages, one comprising the odd-order cells and the other comprising the even-order cells.

Typically, memory controller 40 programs data in page units, but erases entire memory blocks 34. Typically although not necessarily, a memory block is on the order of $10^6$ memory cells, whereas a page is on the order of $10^3$-$10^4$ memory cells.

The description that follows describes several example techniques for finding optimal read thresholds for reading the data stored in memory cells 32. The disclosed techniques can be carried out by memory controller 40 and/or by R/W unit 36. For the sake of clarity, the description that follows refers to a particular division of functions between R/W unit 36 in the memory device and processor 48 in memory controller 40. Generally, however, the various tasks making-up the disclosed techniques can be divided between the memory controller and the R/W unit in any suitable manner, or performed by any one of these elements. Thus, in the context of the present patent application and in the claims, memory controller 40 and R/W circuitry 36 are referred to jointly as storage circuitry that carries out the disclosed techniques.

Figure 2:
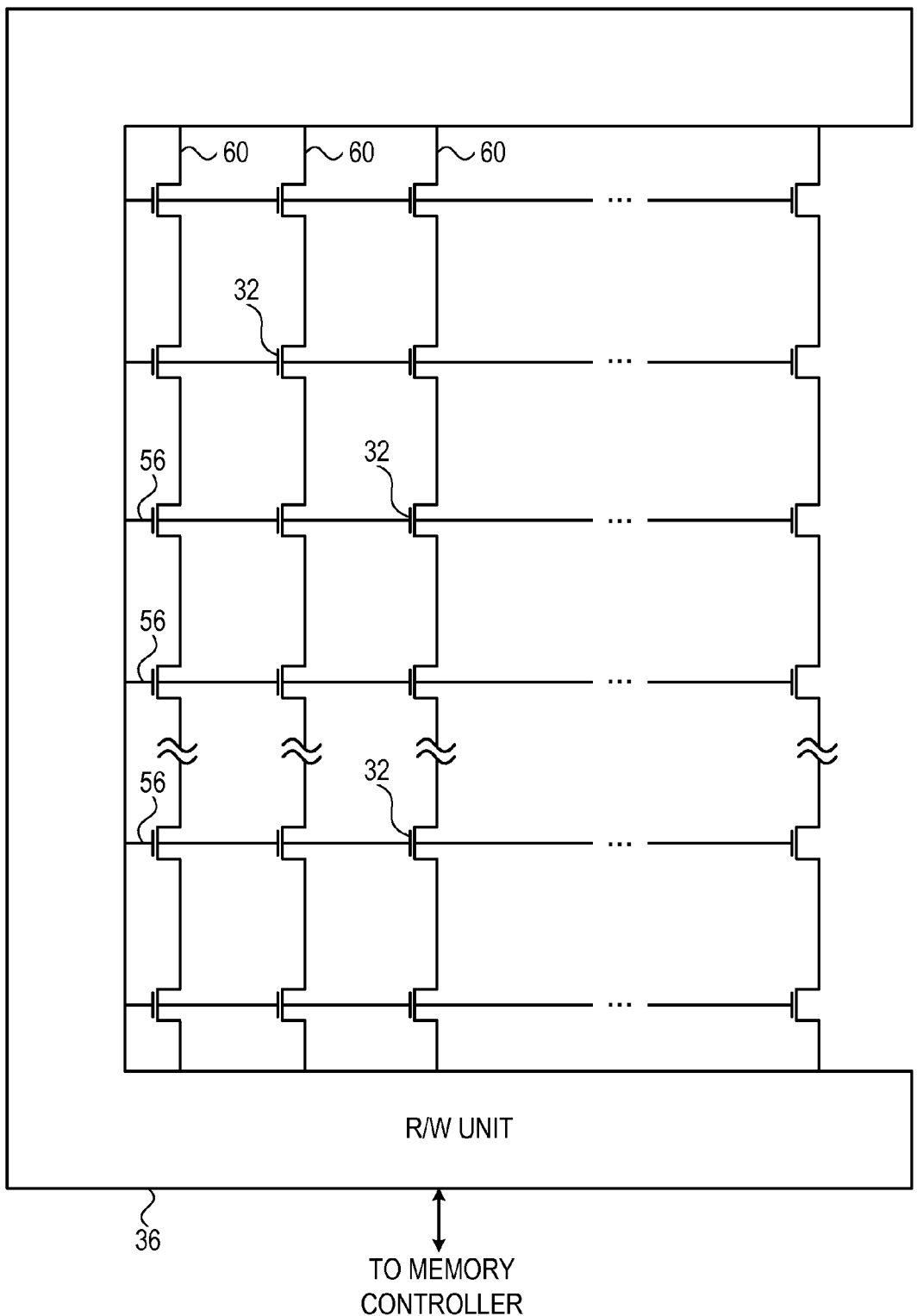
FIG. 2 is a block diagram that schematically illustrates a Read/Write (R/W) unit, in accordance with an embodiment of the present invention.

FIG. 2 is a block diagram that schematically illustrates R/W unit 36, in accordance with an embodiment of the present invention. As explained above, memory cells 32 are arranged in multiple rows and columns, and each memory cell comprises a floating-gate transistor. The gates of the cells in each row are connected by a respective word line 56, and the sources of the cells in each column are connected by a respective bit line 60. The memory cells (transistors) along each bit line 60 are connected source-to-drain in series with one another.

In alternative embodiments, the memory cells of a given word line are divided into groups that are referred to as strings. The memory cells in each string are connected source-to-drain in series with one another, between the bit line and ground. Each string can typically be connected and disconnected individually to the bit line.

In a typical embodiment, R/W unit 36 converts data for storage into analog storage values, applies the appropriate voltages to the bit lines and word lines of the memory, and writes the analog values into memory cells 32. When reading data out of memory cells 32, R/W unit 36 typically converts the analog values of the memory cells into digital samples. R/W unit 36 is typically connected to memory controller 40 or other external system over a suitable interface.

It should be noted that the connectivity scheme of FIG. 2 is an example connectivity scheme, and that any other suitable connectivity scheme can be used in alternative embodiments, for example 3D schemes.

Read Threshold Estimation Using Simultaneous Readout with Different Read Thresholds Per Memory Cell Group In some embodiments, the storage circuitry of system 20 (e.g., memory controller 40 and/or R/W unit 36) evaluates multiple different candidate sets of read thresholds simultaneously, in the same sense operation. Typically, the storage circuitry divides a group of memory cells into multiple subsets, applies a different candidate set of read threshold to each subset, and senses the memory cells in the group simultaneously.

Figure 3:
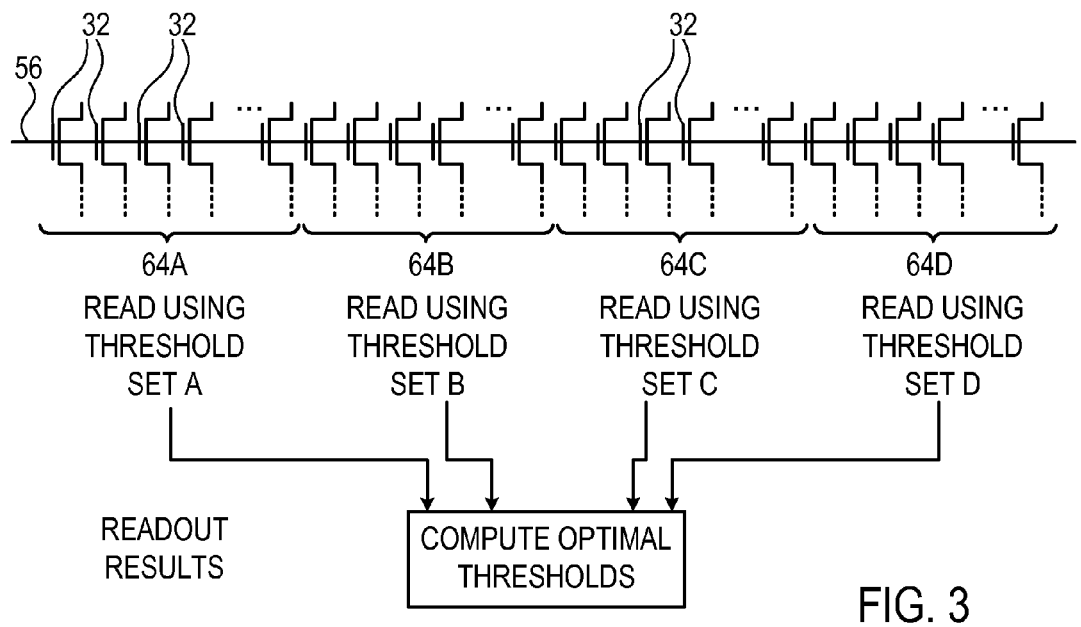
FIG. 3 is a diagram that schematically illustrates a process for simultaneous readout of analog memory cells using multiple sets of read thresholds, in accordance with an embodiment of the present invention.

FIG. 3 is a diagram that schematically illustrates a process for simultaneous readout of analog memory cells using multiple sets of read thresholds, in accordance with an embodiment of the present invention. The figure shows multiple memory cells 32 along a word line 56, each memory cell belonging to a different respective bit line 60 (see FIG. 2). The storage circuitry supports read commands that sense the multiple memory cells along the word line simultaneously, in a single sense operation.

In the present example, memory cells 32 of a given word line 56 are divided into four subsets denoted 64A ... 64D. The scheme of FIG. 3 evaluates four different candidate sets of read thresholds denoted A ... D. Using a single sense operation, the storage circuitry senses the memory cells in subset 64A using candidate read threshold set A, the memory cells in subset 64B using set B, the memory cells in subset 64C using set C, and the memory cells in subset 64D using set D.

The sense operation described above produces four sets of readout results, obtained from subsets 64A ... 64D using read threshold sets A ... D, respectively. The storage circuitry derives an optimal set of read thresholds from these readout results.

Figure 4:
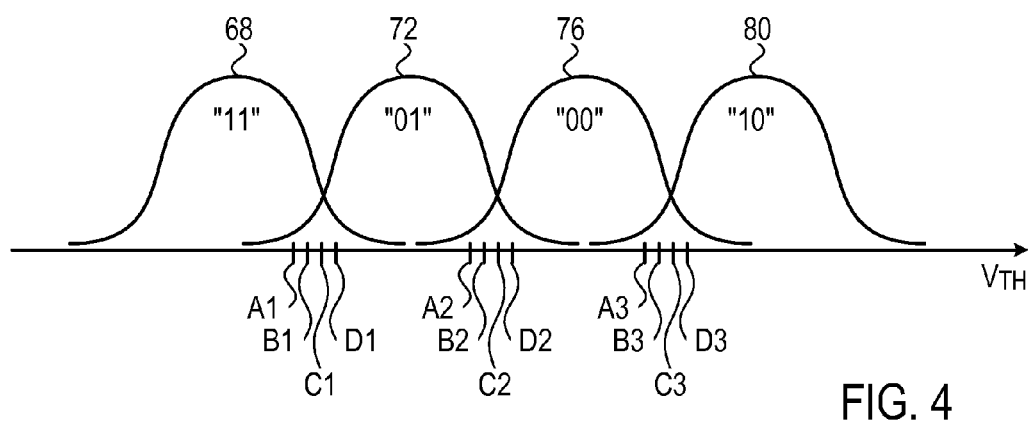
FIG. 4 is a diagram that schematically illustrates threshold voltage distributions in analog memory cells, and associated read thresholds, in accordance with an embodiment of the present invention.

FIG. 4 is a diagram that schematically illustrates threshold voltage distributions in a group of analog memory cells, and associated read thresholds, in accordance with an embodiment of the present invention. In the present example, the group of memory cells are located along a given word line 56. The figure shows the four candidate sets A ... D of read thresholds that are evaluated simultaneously in the scheme of FIG. 3 above.

In this embodiment, the memory cells in the group comprise four-level MLC, each memory cell holding two bits of data. Each memory cell is programmed to one of four possible programming levels, corresponding to four threshold voltage ($V_{TH}$) distributions 68, 72, 76 and 80 that represent the data values "11", "01", "00" and "10", respectively.

The four candidate sets of read thresholds are positioned in the boundary regions between adjacent programming levels, so that the readout results will indicate the stored data with minimal error probability. In the present example each candidate set comprises three read thresholds: Set A comprises read thresholds {A1, A2, A3}, set B comprises read thresholds {B1, B2, B3}, set C comprises read thresholds {C1, C2, C3}, and set D comprises read thresholds {D1, D2, D3}, The embodiment shown in FIGS. 3 and 4 is chosen purely by way of example. In alternative embodiments, any other suitable readout scheme can be used. For example, the storage circuitry may divide any suitable group of memory cells into any suitable number of subsets, and evaluate any desired collection of candidate read threshold sets.

In some embodiments, the storage circuitry computes a quality level for each of the candidate sets of read thresholds, based on the readout results of that set. The storage circuitry then finds the optimal set of read thresholds based on these quality levels. For example, in some embodiments, the data stored in each of subsets 64A ... 64D comprises a separate code word of an Error Correction Code (ECC). Following the single sense operation that reads the multiple subsets, the storage circuitry attempts to decode the four code words. The degree of success in decoding a given code word serves as a quality level of the corresponding candidate set of read thresholds.

In one embodiment, the quality level is binary, i.e., success or failure in decoding the code word using the corresponding candidate set of read thresholds. In other embodiments, the ECC decoding process may indicate the level of decoding success with finer resolution, even if the decoding has failed. In some embodiments, the quality levels may comprise various metrics relating to the ECC, not necessarily proportional to the degree of decoding success. For example, when the ECC is defined by a set of parity check equations, the storage circuitry may assess the number of parity check equations that are satisfied at the end of the decoding process, even if decoding has failed.

The number of satisfied parity check equations can be used as an indication of the degree of success in decoding the code word, and thus as a quality level for the corresponding candidate set of read thresholds. Further aspects of setting read threshold based on the number of satisfied parity check equations are addressed in U.S. Pat. No. 8,156,398, which is assigned to the assignee of the present patent application and whose disclosure is incorporated herein by reference.

Other ECC-related quality measures for the candidate sets of read thresholds comprise, for example, the number of errors detected in the code word, the number of errors corrected in the code word, and the number of errors corrected in either direction (e.g., the ratio between the number of "1"s corrected to "0"s and the number of "0"s corrected to "1"s in the code word). The latter parameter is also indicative of whether the optimal read thresholds are above or below the corresponding candidate read thresholds.

In some embodiments, the ECC used for encoding the data is a product code that is made-up of multiple constituent codes or component codes in two or more dimensions. In these embodiments, the storage circuitry may use the decoding results of the constituent codes in one dimension (which are sensed with the same read thresholds) as a quality level for the candidate sets of read thresholds.

As another example of assessing the quality level of a candidate set of read thresholds, the storage circuitry may measure the statistical distribution of at least some of the cell analog values (e.g., $V_{TH}$) relative to the read thresholds, and compare the measured distribution to an expected distribution. For example, for a given candidate set, the storage circuitry may count the number of memory cells whose $V_{TH}$ falls below each threshold. The storage circuitry then compares these counts to expected values of the counts. If the measured counts are in close agreement with the respective expected counts, the quality level of the candidate is regarded as high, and vice versa.

The storage circuitry may determine the expected counts in various ways. In some embodiments the average values of the expected counts are known in advance, e.g., when the data is scrambled. In other embodiments the storage circuitry may store the actual counts when the data is stored.

As can be seen in FIG. 4, the optimal set of read thresholds lie generally in the intervals covered by the candidate sets. In some embodiments, the storage circuitry selects one of the candidate sets (typically the one having the best quality metric) to serve as the optimal set of read thresholds. Alternatively, however, the storage circuitry may use the quality levels to compute an optimal set of read thresholds that is different from all the candidate sets, for example by interpolation or extrapolation of the quality levels, or in any other suitable way. In some embodiments, the storage circuitry may compute the quality levels by combining the multiple readout results, and applying some processing to the combined result.

Further alternatively, the storage circuitry may compute any other suitable quality levels for the candidate sets of read thresholds based on the readout results, and determine the optimal read thresholds in any other suitable way based on the quality levels.

The storage circuitry may apply different sets of read thresholds to different subsets of memory cells in various ways. In one embodiment, the storage circuitry charges the bit lines of the memory cells in each subset to a different bit line voltage. Different bit line voltages mean that the bit lines in different subsets will discharge at different discharge rates. Sensing the various subsets at the same time (same time offset after starting to discharge the bit lines) is equivalent to applying different read thresholds.

In another embodiment, the storage circuitry applies a different gate voltage to the memory cells in each subset. This mechanism, too, is equivalent to applying different read thresholds.

Another example technique is particularly suitable for (although not limited to) memory cell readout using current sensing. In current sensing implementations, unit typically charges the various bit lines 60, and applies a certain readout voltage (representative of the read threshold) to the word line to be read. After a certain delay, unit 36 senses the electrical currents flowing through the bit lines. The bit line currents serve as indications of the cell threshold voltages, i.e., the bit line conducts when the respective cell threshold voltage is below the word line voltage, and vice versa.

In current sensing applications, the major portion of the overall readout time is made-up of the time needed to charge the bit lines, and a small portion is contributed by the time needed to set the word line voltage. In some embodiments, unit 36 senses the memory cells of a given word line with multiple word line voltages (i.e., multiple read thresholds) in the same charge cycle, without discharging the bit lines. This technique achieves improved readout time.

In an example embodiment, unit 36 charges the bit lines, and then applies a monotonically increasing sequence of read voltages to the word line (without discharging the bit lines between different read voltages). The sequence of read voltages is defined in advance (e.g., provided to unit 36 by memory controller 40) and corresponds to the read thresholds to be tested in this single readout operation. The sequence of read voltages comprises a union of the various sets of read voltages that are to be applied to the various subsets of the memory cells.

The read voltages are arranged in ascending order, not grouped according to the subsets. In an embodiment, unit 36 (e.g., a read buffer in unit 36) uses a respective enable signal for each subset of memory cells, which is enables when the currently-sensed read voltage corresponds to that subset of memory cells. Using this technique, unit 36 is able to sense the multiple subsets of memory cells with different sets of read thresholds in a single cycle of charging the bit lines, and thus achieve short readout time.

Consider, for example, a scenario in which unit 36 reads the Most Significant Bit (MSB) page from a word line of a 2 bits/cell MLC device. In this configuration, each subset of memory cells is sampled with two read voltages denoted RV1 and RV3. In an embodiment, memory controller 40 provides unit 36 with the sequence of read voltages in a monotonically-increasing order. In addition, the memory controller provides for each read voltage a respective indication of the subset of cells that this voltage should be applied to. The sequence in this example will be of the form {RV11,1 RV11,2 RV11,3 RV31,1, RV33,3, RV32,2}. In this example RV11<RV12<RV13<RV31<RV33<RV32. Using the subset index, unit 36 can enable the appropriate enable signal (i.e., sample the appropriate subset of cells) for each read voltage in the sequence.

Further alternatively, the storage circuitry may use any other suitable technique for applying different sets of read thresholds to different subsets of memory cells. In some embodiments, this mechanism can be bypassed so that all the memory cells in the group are sensed using the same read thresholds.

In yet another embodiment, the storage circuitry applies different sets of read thresholds to different subsets of memory cells by sensing each subset after a different discharge time (typically while applying the same gate voltage to all the memory cells in all the subsets). Further alternatively, the storage circuitry may apply different sets of read thresholds to different subsets of memory cells in any other suitable way.

In some embodiments, instead of setting a different fixed voltage (e.g., gate voltage or bit-line charge voltage) to each subset of memory cells, the storage circuitry applies to the memory cells in the group a voltage that is varied (modulated) as a function of the cell position within the group (e.g., as a function of the cell index along the word line). For example, the storage circuitry may apply a voltage that increases in a certain constant slope from cell to cell along the word line. As another example, the storage circuitry may apply a voltage having a periodic waveform (e.g., saw-tooth) as a function of cell position. In these embodiments, the (interleaved) subset of cells whose voltage falls in a certain range is regarded as a respective subset for the purpose of threshold evaluation.

In some embodiments, the threshold evaluation process is further accelerated by sensing one or more of the subsets of memory cells twice or more, at different sense times, in the same single sense operation. Sampling a bit line, which is in the process of discharging, at different times is equivalent to applying different read thresholds. Thus, a large number of candidate sets of read thresholds can be evaluated in the same sense operation. Some candidate sets are multiplexed spatially (i.e., in different subsets of memory cells) and some sets are multiplexed temporally (i.e., by sensing the same memory cells at different sense times during a single discharge cycle). Further aspects of sensing memory cells multiple times in the same discharge cycle are addressed in U.S. patent application Ser. No. 13/284,909, which is assigned to the assignee of the present patent application and whose disclosure is incorporated herein by reference.

Figure 5:
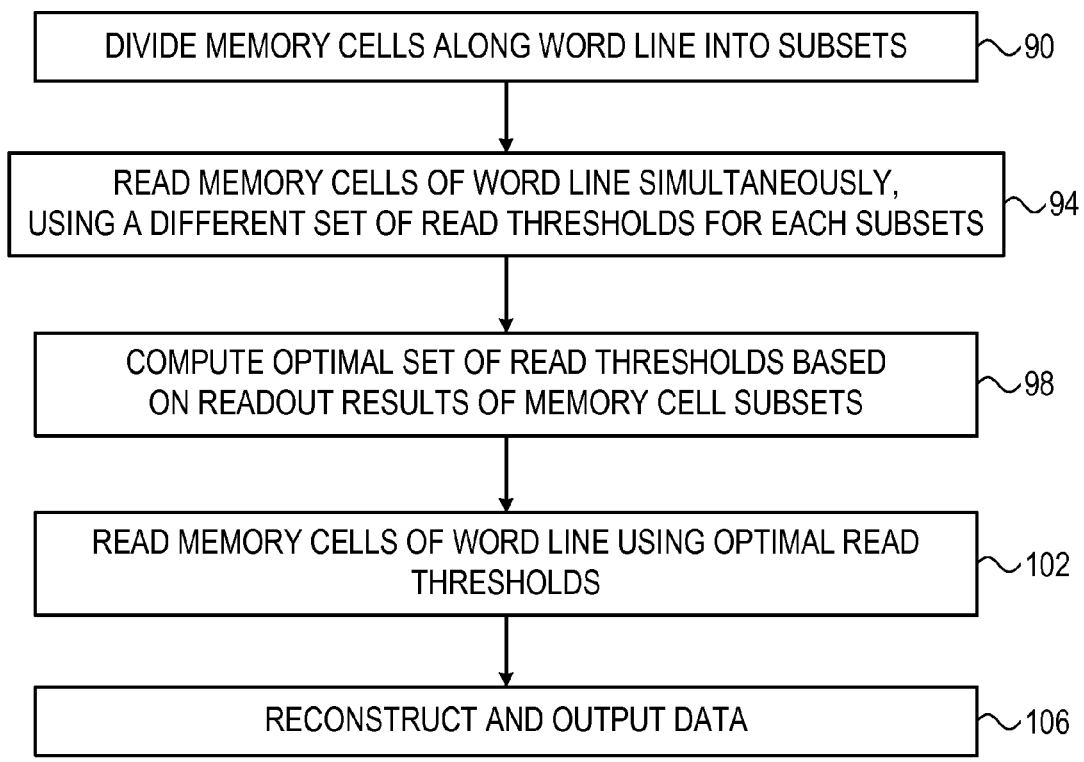
FIG. 5 is a flow chart that schematically illustrates a method for read threshold estimation, in accordance with an embodiment of the present invention.

FIG. 5 is a flow chart that schematically illustrates a method for read threshold estimation, in accordance with an embodiment of the present invention. The method begins with the storage circuitry dividing a group of memory cells 32 (e.g., a word line 56) into multiple subsets, at a partitioning step 90. The storage reads the memory cells in the group simultaneously in a single sense operation, while applying a different set of candidate read thresholds to each subset, at a readout step 94.

The storage circuitry computes an optimal set of read thresholds based on the readout results of the various subsets, at a threshold computation step 98. The storage circuitry reads the memory cells in the group (or another group) using the optimal read thresholds, at a readout step 102. The storage circuitry reconstructs the stored data from the readout results of step 102, and outputs the reconstructed data, at a reconstruction and output step 106.

The method of FIG. 5 may be repeated, e.g., periodically or in response to some triggering event, so as to refine and track the optimal read thresholds over time.

Although the embodiments described herein mainly address NAND Flash memory, the methods and systems described herein can also be used in other applications, such as in other memory technologies such as R-RAM, PCM, NOR Flash and others.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method, comprising:
  dividing a group of analog memory cells into multiple subsets;
  sensing the memory cells in the group simultaneously by performing a single sense operation, while applying to the subsets of the memory cells respective different sets of read thresholds, so as to produce respective readout results; and
  estimating an optimal set of the read thresholds by processing the multiple readout results obtained from the respective subsets using the different sets of the read thresholds;
  wherein estimating the optimal set of the read thresholds comprises assessing respective quality levels of the different sets of read thresholds based on the corresponding readout results, and deriving the optimal set of read thresholds from the quality levels
  wherein the multiple subsets of the memory cells store respective separate Error Correction Code (ECC) code words, and wherein assessing the quality levels comprises assessing respective metrics relating to the respective ECC code words.

2. The method according to claim 1, wherein the memory cells in the group are associated with a single word line.

3. The method according to claim 1, wherein the metrics comprise respective degrees of success in decoding the respective ECC code words.

4. The method according to claim 1 wherein assessing the quality levels comprises assessing respective statistical distributions of analog values of the memory cells relative to the read thresholds.

5. The method according to claim 1, wherein deriving the optimal set of the read thresholds comprises assessing the quality levels by combining the readout results, and processing the combined readout results to produce the optimal set.

6. The method according to claim 1, wherein applying the different sets of the read thresholds comprises charging bit lines in each subset of the memory cells to a different respective charge voltage.

7. The method according to claim 1, wherein applying the different sets of the read thresholds comprises applying a different respective gate voltage to the memory cells in each of the subsets.

8. The method according to claim 1, wherein applying the different sets of the read thresholds comprises varying a voltage applied to the memory cells as a function of respective positions of the memory cells within the group.

9. The method according to claim 1, wherein applying the different sets of the read thresholds comprises sensing bit lines in each subset of the memory cells after a different discharge time.

10. The method according to claim 1, wherein the memory cells are connected to respective bit lines and arranged along a word line, wherein applying the different sets of the read thresholds comprises applying multiple different read voltages to the word line during a single cycle of charging the bit lines, and wherein sensing the memory cells comprises sensing each subset of the memory cells using one or more of the read voltages corresponding to the subset.

11. The method according to claim 1, and comprising reading the memory cells in the group using the optimal set of the read thresholds.

12. The method according to claim 1, wherein estimating the optimal set of the read thresholds comprises selecting one of the different sets of the read thresholds to serve as the optimal set.

13. The method according to claim 1, wherein the optimal set of the read thresholds differs from any of the different sets of the read thresholds.

14. The method according to claim 1, and comprising, during the single sense operation, sensing the memory cells in at least one of the subsets at an additional sense time so as to produce additional readout results that correspond to an additional set of the read thresholds, and wherein estimating the optimal set comprises processing the multiple readout results and the additional readout results.

15. Apparatus, comprising:
a memory, which comprises a plurality of analog memory cells; and
storage circuitry, which is configured to:
divide a group of the memory cells into multiple subsets, wherein each subset of the multiple subsets is configured to store a respective one of separate Error Correction Code (ECC) code words;
sense the memory cells in the group simultaneously by performing a single sense operation, while applying to the subsets of the memory cells respective different sets of read thresholds, so as to produce respective readout results;
estimate an optimal set of the read thresholds by processing the multiple readout results obtained from the respective subsets using the different sets of the read thresholds;
assess respective quality levels of the different sets of the read thresholds based on the corresponding readout results; and
derive the optimal set of the read thresholds from the quality levels;
wherein to assess the quality levels of the different sets, the storage circuitry is further configured to assess respective metrics relating to the respective ECC code words.

16. The apparatus according to claim 15, wherein the memory cells in the group are associated with a single word line.

17. The apparatus according to claim 15, wherein the metrics comprise respective degrees of success in decoding the respective ECC code words.

18. The apparatus according to claim 15, wherein the storage circuitry is further configured to assess the quality levels by assessing respective statistical distributions of analog values of the memory cells relative to the read thresholds.

19. The apparatus according to claim 15, wherein the storage circuitry is further configured to assess the quality levels by combining the readout results, and to process the combined readout results to produce the optimal set.

20. The apparatus according to claim 15, wherein the storage circuitry is further configured to apply the different sets of the read thresholds by charging bit lines in each subset of the memory cells to a different respective charge voltage.

21. The apparatus according to claim 15, wherein the storage circuitry is further configured to apply the different sets of the read thresholds by applying a different respective gate voltage to the memory cells in each of the subsets.

22. The apparatus according to claim 15, wherein the storage circuitry is further configured to apply the different sets of the read thresholds by varying a voltage applied to the memory cells as a function of respective positions of the memory cells within the group.

23. The apparatus according to claim 15, wherein the storage circuitry is further configured to apply the different sets of the read thresholds by sensing bit lines in each subset of the memory cells after a different discharge time.

24. The apparatus according to claim 15, wherein the memory cells are connected to respective bit lines and arranged along a word line, and wherein the storage circuitry is configured to apply the different sets of the read thresholds by applying multiple different read voltages to the word line during a single cycle of charging the bit lines, and to sense each subset of the memory cells using one or more of the read voltages corresponding to the subset.

25. The apparatus according to claim 15, wherein the storage circuitry is further configured to read the memory cells in the group using the optimal set of the read thresholds.

26. The apparatus according to claim 15, wherein the storage circuitry is further configured to select one of the different sets of the read thresholds to serve as the optimal set.

27. The apparatus according to claim 15, wherein the optimal set of the read thresholds differs from any of the different sets of the read thresholds.

28. The apparatus according to claim 15, wherein the storage circuitry is further configured to sense, in the single sense operation, the memory cells in at least one of the subsets at an additional sense time so as to produce additional readout results that correspond to an additional set of the read thresholds, and to estimate the optimal set by processing the multiple readout results and the additional readout results.

29. Apparatus, comprising:
an interface, which is configured to communicate with a memory that comprises a plurality of analog memory cells; and
storage circuitry, which is configured to:
divide a group of the memory cells into multiple subsets;
sense the memory cells in the group simultaneously by performing a single sense operation, while applying to the subsets of the memory cells respective different sets of read thresholds, so as to produce respective readout results;

estimate an optimal set of the read thresholds by processing the multiple readout results obtained from the respective subsets using the different sets of the read thresholds;

Wherein to estimate the optimal set of read thresholds, the storage circuitry is further configured to:

assess respective quality levels of the different sets of read thresholds based on the corresponding readout results; and derive the optimal set of read thresholds from the quality levels;

wherein the multiple subsets of the memory cells store respective separate Error Correction Code (ECC) code words; and wherein to assess the quality levels, the storage circuitry is further configured to assess respective metrics relating to the respective ECC code words.

* * * * *